(12) United States Patent
Jindal et al.

(10) Patent No.: US 8,734,907 B2
(45) Date of Patent: May 27, 2014

(54) COATING OF SHIELD SURFACES IN DEPOSITION SYSTEMS

(75) Inventors: Vibhu Jindal, Albany, NY (US); Junichi Kageyama, Yokohama (JP)

(73) Assignees: Sematech, Inc., Albany, NY (US); Asahi Glass Co., Ltd., Tokyo (JP)

( * ) Notice: Subject to any disclaimer, the term of this patent is extended or adjusted under 35 U.S.C. 154(b) by 108 days.

(21) Appl. No.: 13/365,070

(22) Filed: Feb. 2, 2012

(65) Prior Publication Data
US 2013/0202990 A1    Aug. 8, 2013

(51) Int. Cl.
*B05D 3/10* (2006.01)

(52) U.S. Cl.
USPC .............................. 427/337; 427/142; 427/560

(58) Field of Classification Search
USPC ............ 134/2, 8, 26; 427/140, 446, 142, 337, 427/56
See application file for complete search history.

(56) References Cited

U.S. PATENT DOCUMENTS

| | | |
|---|---|---|
| 2,806,000 A | 9/1957 | Streicher |
| 5,164,016 A | 11/1992 | Henriet et al. |
| 5,766,684 A | 6/1998 | Shah et al. |
| 5,858,118 A | 1/1999 | Shah et al. |
| 5,951,372 A | 9/1999 | Choquette et al. |
| 6,235,120 B1 | 5/2001 | Bang et al. |
| 6,772,776 B2 | 8/2004 | Klebanoff et al. |
| 6,942,764 B1 | 9/2005 | Lin et al. |
| 7,026,009 B2 | 4/2006 | Lin et al. |
| 7,147,722 B2 | 12/2006 | Klebanoff et al. |
| 7,579,067 B2 | 8/2009 | Lin et al. |
| 2002/0090464 A1 | 7/2002 | Jiang et al. |
| 2003/0196890 A1 | 10/2003 | Le et al. |
| 2004/0099285 A1 * | 5/2004 | Wang et al. ........................ 134/8 |
| 2005/0089699 A1 * | 4/2005 | Lin et al. ........................ 428/457 |
| 2005/0147742 A1 | 7/2005 | Kleshock et al. |
| 2006/0131515 A1 | 6/2006 | Partlo et al. |
| 2010/0025231 A1 | 2/2010 | Moriya et al. |

* cited by examiner

*Primary Examiner* — Stewart Fraser
(74) *Attorney, Agent, or Firm* — Nixon Peabody LLP; Khaled Shami

(57) ABSTRACT

A deposition chamber shield having a stainless steel coating of from about 100 microns to about 250 microns thick wherein the coated shield has a surface roughness of between about 300 microinches and about 800 microinches and a surface particle density of less than about 0.1 particles/mm² of particles between about 1 micron and about 5 microns in size and no particles below about 1 micron in size, and process for production thereof is disclosed.

17 Claims, 6 Drawing Sheets

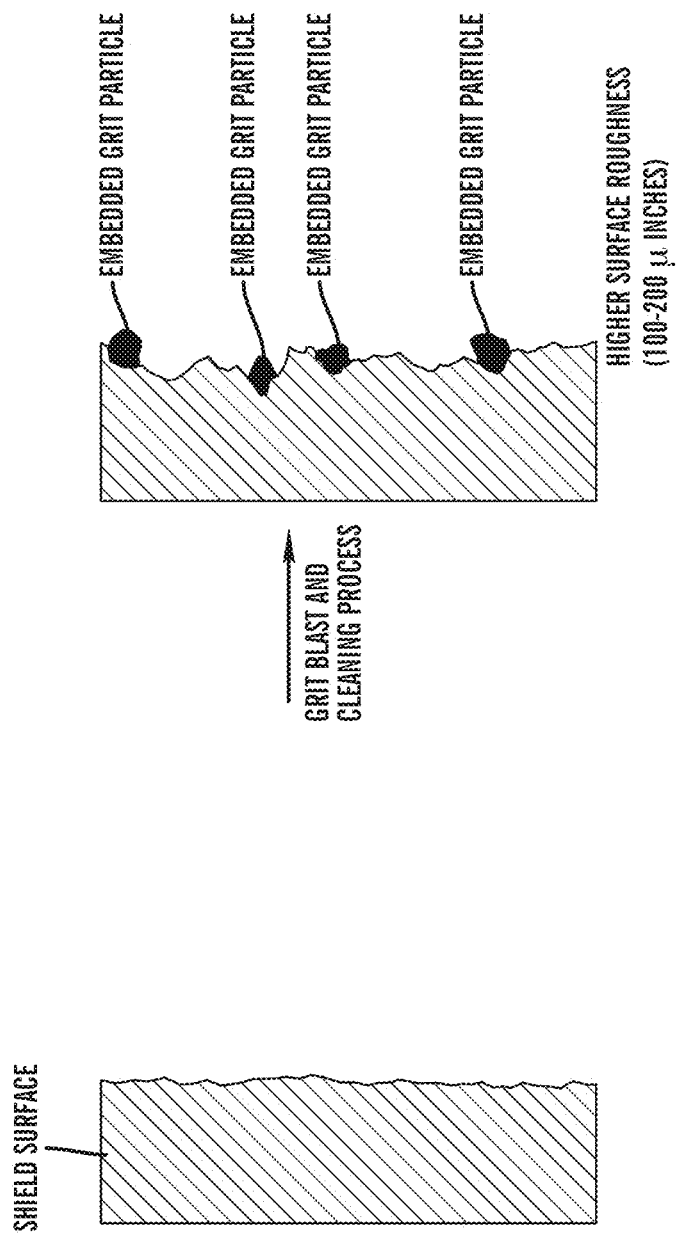

COATING OF SHIELD SURFACES IN DEPOSITION SYSTEMS

FIELD

The present disclosure relates to stainless steel coated deposition system shields, and in particular, deposition system shields coated with stainless steel having a high surface roughness and low particle residue, and methods for the production and use thereof.

BACKGROUND

A substrate deposition system may be used to process a substrate with an energized gas, such as plasma. Typically, the system includes a deposition chamber which encloses a process zone into which a gas is introduced, a gas energizer to energize the gas, a target which provides a source of material and an exhaust to remove the energized gas. The deposition chamber may, for example, be used to deposit material on the substrate.

The chamber components exposed to the energized gas and sputtered material are often covered with removable shields which protect the surface of the chamber components from the sputtered residues used to deposit material on the substrate. The sputtered material coats the shields during use and unless the shields are removed and replaced, the layer can reach a thickness such that particles begin to flake off and contaminate the process chamber. In subsequent processing cycles, the deposited process residues can flake off of the shield surfaces and fall upon and contaminate the substrate. Therefore, the shields must be frequently and periodically removed and cleaned of surface residue. Manufacturers often use sandblasting to roughen the shield, which allows them to run the sputtering chamber for longer periods of time without a shield change, reducing the down time of process equipment. However, sandblasting leaves particle residue on the surface of the shields which can increase the chances of contamination of the substrate.

U.S. Patent Application Publication No. 2002/0090464 to Jiang et al. relates to a method for preparing a shield for use in physical vapor deposition systems. Initially, a base plate material is shaped to fit inside the physical vapor deposition chamber. The surface of the shield is then degreased with moderate acid etch to prepare for roughening by sand or grit blasting. The grit blasting typically provides an initial surface texture with a roughness value ($R_a$) up to 250 microinches. The shield is then cleaned and a coating layer between about 0.005 inch to 0.002 inch in thickness is applied by a thermal spraying process, such as thermal arc spraying to produce a surface roughness ($R_a$) typically in the range of 400 microinches to 1200 microinches. After deposition, the shield is cleaned in an ultrasonic bath and blasted with pressurized air and then baked.

Thus, it is desirable to provide a coated shield which minimizes the amount of flake off of process residue. It is further desirable to provide a coated shield having a high surface roughness and low particle residue to deposit low defect films on substrates and process a larger number of substrates in the chamber while reducing the frequency of chamber downtime for cleaning and replacing of shields.

SUMMARY

One aspect of the present invention provides a method for coating a deposition chamber shield, including: a) providing a deposition shield having a primed surface, b) coating the primed shield surface with a stainless steel coating having a thickness of from about 100 microns to about 250 microns, and c) cleaning the coated surface to remove loose particles to provide a stainless steel coated shield having a surface roughness of between about 300 microinches and about 800 microinches and a surface particle density of less than about 0.1 particles/mm$^2$ of particles between about 1 micron and about 5 microns in size and no particles below about 1 micron in size.

Another aspect of the present invention provides a coated deposition chamber shield, including: a shield having a stainless steel coating wherein the coated shield has a surface roughness of between about 300 microinches and about 800 microinches and a surface particle density of less than about 0.1 particles/mm$^2$ of particles between about 1 micron and about 5 microns in size and no particles below about 1 micron in size.

Another aspect of the present invention provides a EUVL mask blank and a deposition method including providing in a deposition chamber the coated shield and depositing a layer on the EUVL mask blank.

BRIEF DESCRIPTION OF THE DRAWINGS

These and other aspects of the present invention will become apparent upon a review of the following detailed description, accompanying claims, and appended drawings, which illustrate examples of the invention, where:

FIG. 1 is a schematic side view of an embodiment of a used shield in accordance with the present invention;

FIG. 2 is a schematic side view of the shield of FIG. 1 following grit blasting to roughen the surface to between 100 and 200 microinches and showing embedded grit particles after a conventional cleaning process;

DETAILED DESCRIPTION

Figure 4:
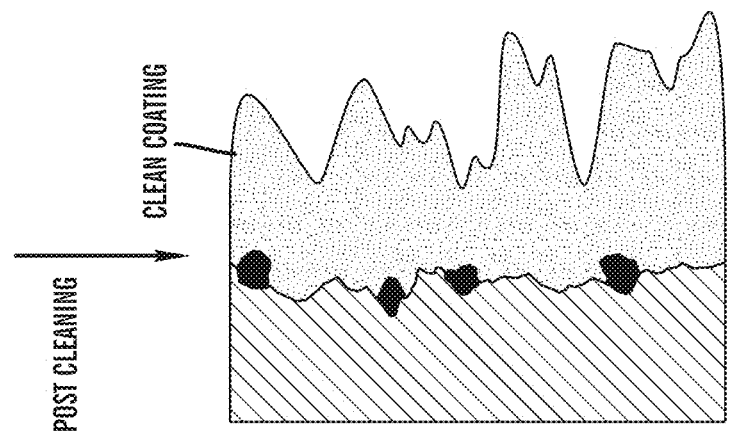
FIG. 4 is a schematic side view of the shield of FIG. 3 undergoing a post coating cleaning process to remove surface particles showing a roughened and cleaned shield surface.

During the sputtering process, such as manufacturing for mask blank for extreme ultraviolet lithography ("EUVL"), material is deposited on the substrate as well as the shields used to protect the deposition chamber surfaces. Materials adhere to the shield surfaces and over time tend to flake off the shields onto the substrates and contaminate the substrates. To minimize contamination from the shields, the shields are periodically removed and cleaned.

The present invention relates to a process for coating pre-cleaned shield surfaces with stainless steel. Preferably, the shields are made of stainless steel. The stainless steel coated shield has a surface roughness of between about 300 microinches and about 800 microinches and a surface particle density of less than about 0.1 particles/mm² of particles between about 1 micron and about 5 microns in size. Preferably, the surface roughness is between about 400 microinches and about 600 microinches, more preferably between about 450 microinches and about 550 microinches, particularly preferably between about 480 microinches and about 520 microinches, and more particularly preferably about 500 microinches. Preferably the surface has no particle residue below about 1 micron in size. The stainless steel coating can be applied by techniques known in the art such as by thin wire arc spray process, plasma spray and thermal spray process.

When the surface roughness of shields that have been previously cleaned and coated with a layer of material is less than about 300 microinches, the defects coming from the shields and deposition on the shields are increased. The deposition film growth of deposited material on shields will cause stress buildup with time. The stress is relieved by cracking of the thin film deposition which causes particle generation. The roughness of the surface area can be increased to avoid film cracking The high surface roughness of the shield surface does not let stress build up as the deposited thin film is discontinuous. However, when the surface roughness of the shields is increased to more than about 800 microinches, the defects coming from the shields and depositing on the substrate are increased due to particles, such as $Al_2O_3$, that reside on the shields as a result of the grit blasting process to generate such a high surface roughness shield surface. Coating a layer of material on the surface is not sufficient to prevent these large particles from dislodging.

Surface roughness is defined as $R_a$ which is the arithmetic average of the absolute values of the collected roughness data points. These values characterize the surface based on the vertical deviations of the roughness profile from the mean line. The average roughness, $R_a$, is expressed in units of height, which is typically expressed in "millionths" of an inch and is also referred to as "microinches". The surface roughness for such high roughness can be determined by electronic gauges, e.g., Mitutoyo Surftest SJ-201, where a stylus records the vertical movement along the surface measuring the displacement. The vertical displacement of the stylus is further amplified, recorded and processed to calculate the roughness value.

The pre-cleaning of the shields prior to the coating process can be achieved by processes known in the art. The precleaning process provides a shield surface suitable for coating with stainless steel. A shield having a surface suitable for accepting a stainless steel coating is referred to herein as a primed shield. A primed shield has a surface that has been sufficiently cleaned to remove residue that would inhibit adherence of coating material. The residues removed include deposition from previous processes, oil, grease, contaminants due to handling, shipping, etc. A primed shield preferably has a surface roughness of between about 100 microinches and about 200 microinches, preferably at least about 150 microinches, and has little particle residue left on the surface after various etching and cleaning techniques. A suitable method for cleaning a shield to provide a primed shield is disclosed in U.S. Patent Application entitled "Process for Cleaning Shield Surfaces in Deposition Systems" by Jindal et al., filed concurrently herewith, which is hereby incorporated by reference in its entirety.

Initially, as shown in FIG. 1, there is provided a used shield in need of restoration. FIG. 2 is a schematic side view of the used shield of FIG. 1 showing embedded grit particles following grit blasting to remove deposition residue and roughen the surface to between about 100 microinches and about 200 microinches and after a conventional cleaning process. Thus, the primed shield of FIG. 2 has a surface in which the deposition residue has been removed and the surface is suitable to accept a coating. Optionally, the surface of the primed shield may be treated with adhesion promoters to facilitate adhesion of the coating. Masking can be applied to the shield portions that are not desired to be coated.

Figure 3:
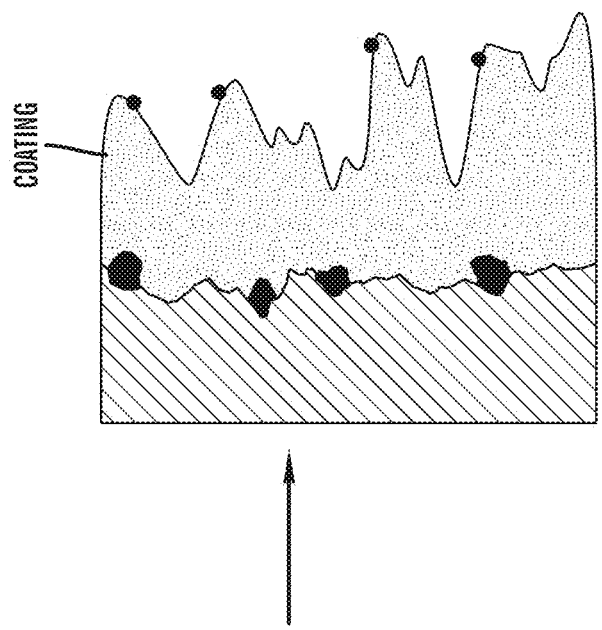
FIG. 3 is a schematic side view of the primed shield of FIG. 2 undergoing stainless steel coating to cover the embedded grit particles.

FIG. 3 is a schematic side view of the primed shield of FIG. 2 undergoing stainless steel coating to cover the embedded grit particles. The stainless steel coating is applied to the unmasked portions by conventional processes, such as thin wire arc spray or plasma spray. The coating is applied to provide a thickness of from about 100 microns to about 250 microns, preferably from about 110 microns to about 150 microns, more preferably from about 115 microns to about 135 microns. Coatings having a thickness of less than about 100 microns are too thin and tend to crack during subsequent use of the shields. The cracking of films can cause particle generation which is not desired as they become deposited on the target as surface defects. Coatings having a thickness of from about 100 microns to about 250 microns have a thickness sufficient to cover all surface particles. Coatings having a thickness of greater than about 250 microns exhibit flaking which can cause particle generation. During application of the stainless steel coating, the surface roughness is adjusted to between about 300 microinches and about 800 microinches, preferably between about 400 microinches and about 600 microinches, more preferably between about 450 microinches and about 550 microinches, and particularly preferably about 500 microinches.

FIG. 4 is a schematic side view of the shield of FIG. 3 undergoing a post coating cleaning process, which includes at least one of a chemical cleaning, wash, and ultrasonication, to remove surface particles showing a roughened and cleaned coated shield surface. In accordance with one embodiment, the mask coating is removed and the coated shield parts are exposed to a high pressure water rinse, preferably at a temperature of between about 50° C. and about 80° C., a pressure of from about 1 kPa to about 5 kPa, and for a time of from about 10 minutes to about 50 minutes, more preferably at a pressure of about 2 kPa for a rinse time of about 30 minutes at a temperature of about 50° C. The coated shield parts can then be exposed to a chemical clean. Suitable chemical clean solutions include an acid clean, a basic clean, and combinations thereof. Suitable acidic clean solutions include aqueous solutions of $HNO_3+HF$, preferably an approximately 0.5% $HNO_3+0.5\%$ $HF+H_2O$ solution. Suitable basic clean solutions include aqueous solutions of $KOH+KMnO_4$ solution, preferably an approximately 15 to 25% $KOH+20$ to 35% $KMnO_4+H_2O$ solution. Preferably, the shields are exposed to the chemical clean solutions for a dip time of between about 30 seconds and about 30 minutes. The dip time can extend beyond 30 minutes so long as the coating is not excessively etched. The chemically cleaned shield parts are then exposed to a high pressure water rinse under the conditions noted above. The shield parts can then be ultrasonicated, preferably for a suitable time at a setting of from about 1 kHz to about 1 GHz, more preferably for about 5 minutes at about 5 kHz and for about 5 minutes at about 20 kHz. The different cleaning methods, are used alone or combined to preferably ensure that no particle residue is left on top of the coating surface as a result of coating process or handling. The process provides stainless steel coated shields having a surface roughness of between about 300 microinches and about 800 microinches and a surface particle density of less than about 0.1 particles/mm² of particles between about 1 micron and about 5 microns in size with no particle residue below about 1 micron on the surface. The coated shield parts are optionally vacuum baked and can be packed for storage or shipping.

The SS coated shields of the present invention are useful in applications where low particle residue is important, e.g., mask blank manufacturing for EUVL. The present invention provides SS coated shields having the following qualities: (a) 300 microinches or higher roughness, (b) little or no particle residue, (c) a strongly adhered stainless steel shield surface, (d) does not generate particles under ion beam deposition, and (e) can be cleaned by simple processes that restore surfaces to their original condition. In contrast, different coating materials on shield surfaces were investigated, including arc-sprayed Al, $Al_2O_3$ and $Y_2O_3$. Although the conventional arc-sprayed Al coating on shield surfaces achieved very high roughness, effectively reducing Si-related defects, particles generated by the Al coatings during deposition were problematic and offset any overall improvement in total defect counts.

A mask blank is a laminate before patterning, to be used for the production of a photomask. An EUV mask blank has a structure wherein a reflective layer to reflect EUV light and an absorber layer to absorb EUV light are formed in this order on a substrate made of, e.g., glass. As the reflective layer, a Mo/Si multilayer reflective film is usually employed wherein a molybdenum (Mo) film as a low refractive index layer and a silicon (Si) film as a high refractive index layer are alternately laminated to increase the light reflectance when the layer surface is irradiated with EUV light.

For the absorber layer, a material having a high EUV light absorption coefficient, specifically a material containing chromium (Cr) or tantalum (Ta) as the main component, is employed.

A protective layer is usually formed between the reflective layer and the absorber layer. Such a protective layer is provided for the purpose of protecting the reflective layer so that the reflective layer will not be damaged by the etching process carried out for the purpose of forming a pattern in the absorber layer. Accordingly, for the protective layer, it is preferred to employ a material not susceptible to influence by the etching process. Further, the protective layer is required not to lower the reflectance of EUV ray, since the reflective layer of the mask blank is irradiated with EUV light in a state where the protective layer is formed. For these reasons, as the constituting material for the protective layer, Ru or a Ru compound (such as RuB, RuNb or RuZr) is preferred.

In the production of an EUV mask blank, a sputtering method is preferably employed for the formation of the Mo/Si multilayer reflective film, the protective layer and the absorber layer in order that a uniform film thickness can easily be obtained, the takt time is short, the film thickness can easily be controlled, etc. For the formation of the Mo film and the Si film constituting the Mo/Si multilayer reflective film, and the protective layer, an ion beam sputtering method is preferably used, and for the formation of the absorber layer, a magnetron sputtering method is preferably employed.

The sputtering method is a film-forming method wherein a sputtering target surface is bombarded by charged particles to beat out sputtered particles from the target so that the sputtered particles are deposited on a substrate disposed to face the target thereby to form a thin film. For a sputtering target to be used for such a film forming method, it is common to apply a structure wherein a target main body made of a film-forming material is held by a substrate so-called a backing plate.

EXAMPLES

The invention will be further illustrated with reference to the following specific examples. It is understood that these examples are given by way of illustration and is not meant to limit the disclosure or the claims to follow.

Comparative Example A

Figure 5:
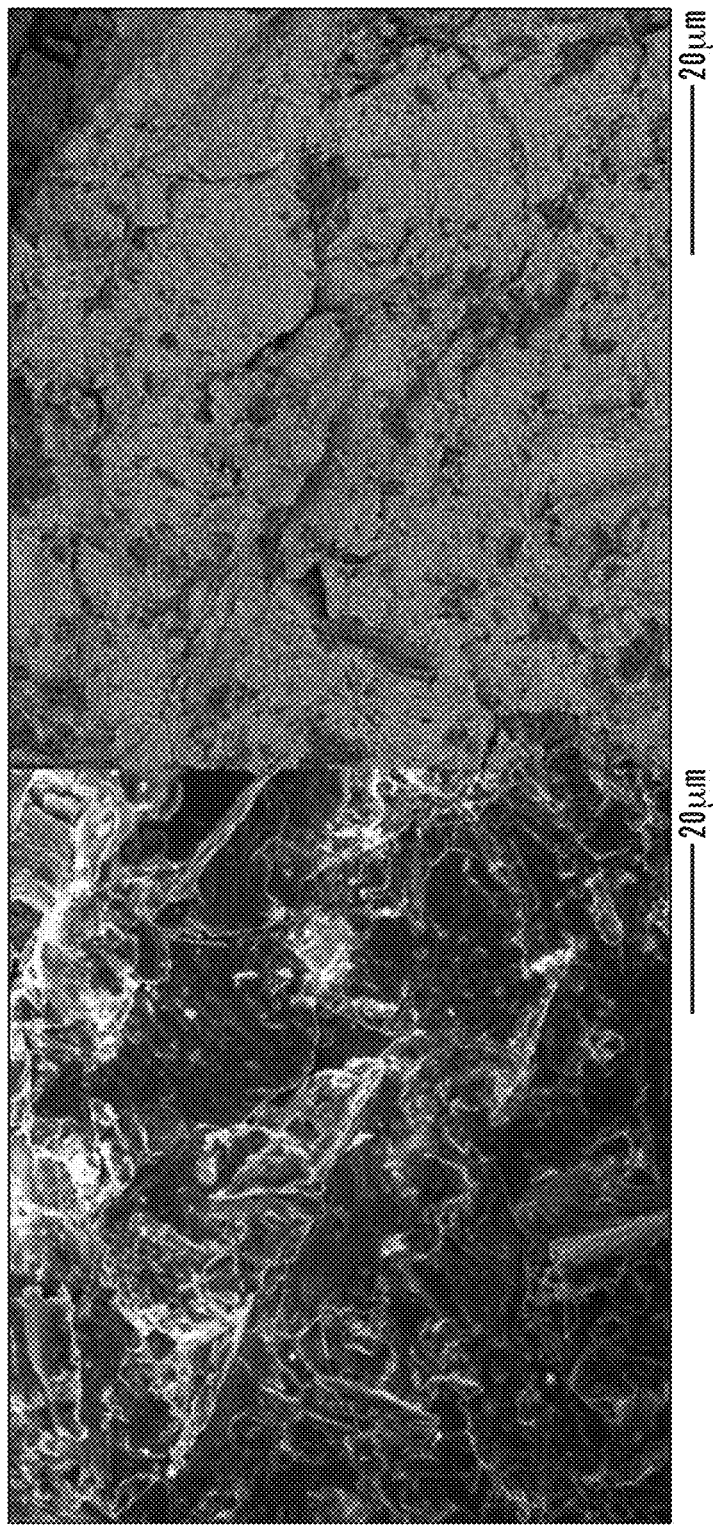
FIG. 5 is pair of SEM images of a shield surface cleaned with a conventional cleaning process according to Comparative Example A.
Figure 8:
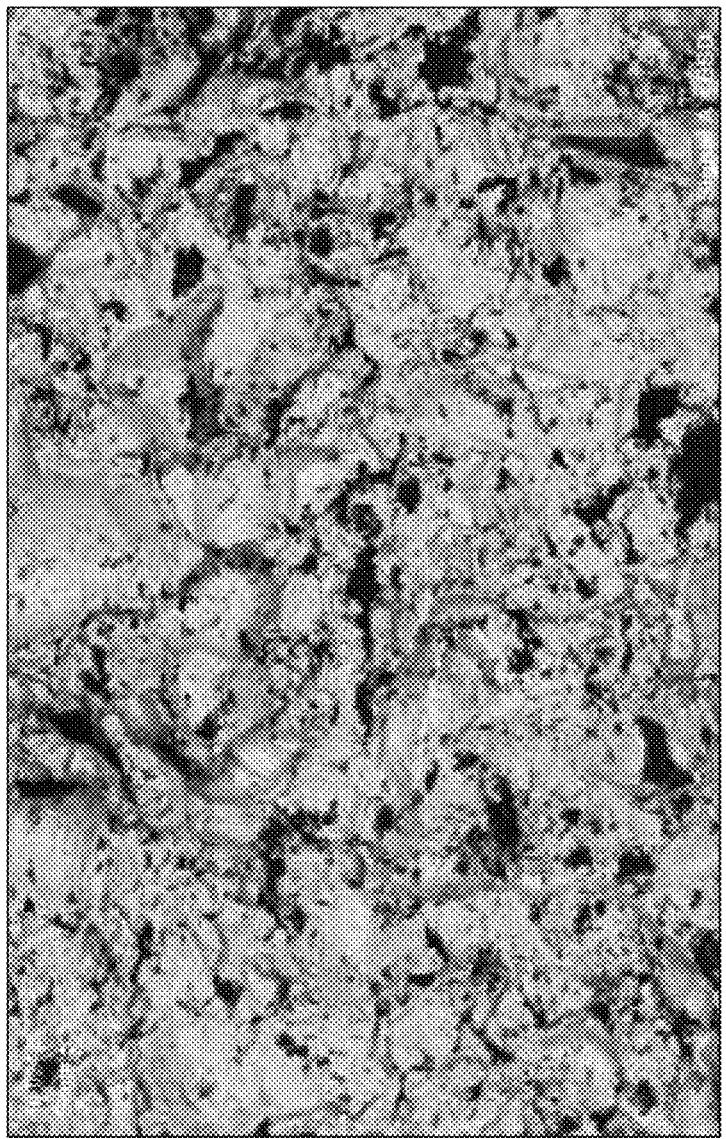
FIG. 8 is an SEM image of a shield surface cleaned with conventional cleaning process according to Comparative Example A.

Used stainless steel shield parts were cleaned by the following conventional chemical cleaning treatment process. The shield parts were grit blasted with 80 grit size under a pressure of 30 psi. The grit surface residue was then blown off with dry air. The shield parts were then immersed in HCl (20%) for 5 minutes. After spray rinse with de-ionized water, the parts were blown dry with dry air. The cleaned shields had a surface roughness of from 125 to 150 microinches with a surface particle density of 100 particles/$mm^2$. FIG. 5 shows a pair of SEM images and FIG. 8 shows an SEM image of shield surfaces cleaned with a conventional cleaning process according to Comparative Example A.

Comparative Example B

Used stainless steel shield parts were cleaned to provide a primed surface after which they were coated with Aluminum (Al) by an arc-spray process. The shield parts that had been used in a deposition process before were removed and pre-cleaned by a grit blast process with 80 grit size followed by chemical etching of the surface to remove loose particles. The surface roughness of the primed shields was found to be 150 microinches. The shields were then masked to provide the Al coating. An arc spray process was used to put an Al coating of 100 microns having a surface roughness of more than about 650 microinches. The mask coating was then removed. The shield surface with coating was then cleaned with a high pressure water rinse at 2 kPa for 30 minutes. The shield parts were then dipped in a 0.5% $HNO_3$+0.5% HF+$H_2O$ solution for 15 minutes. The shield parts were then again exposed to a high pressure water rinse as that noted above. The shield parts were ultrasonicated for 5 minutes at 5 kHz and then for 5 minutes at 20 kHz. This process provided shields having a surface roughness of about 550 microinches and a surface particle density of 100 particles/$mm^2$. The shield parts were then vacuum baked and packed.

Example 1

Coating of Primed Shields with Stainless Steel—

Figure 6:
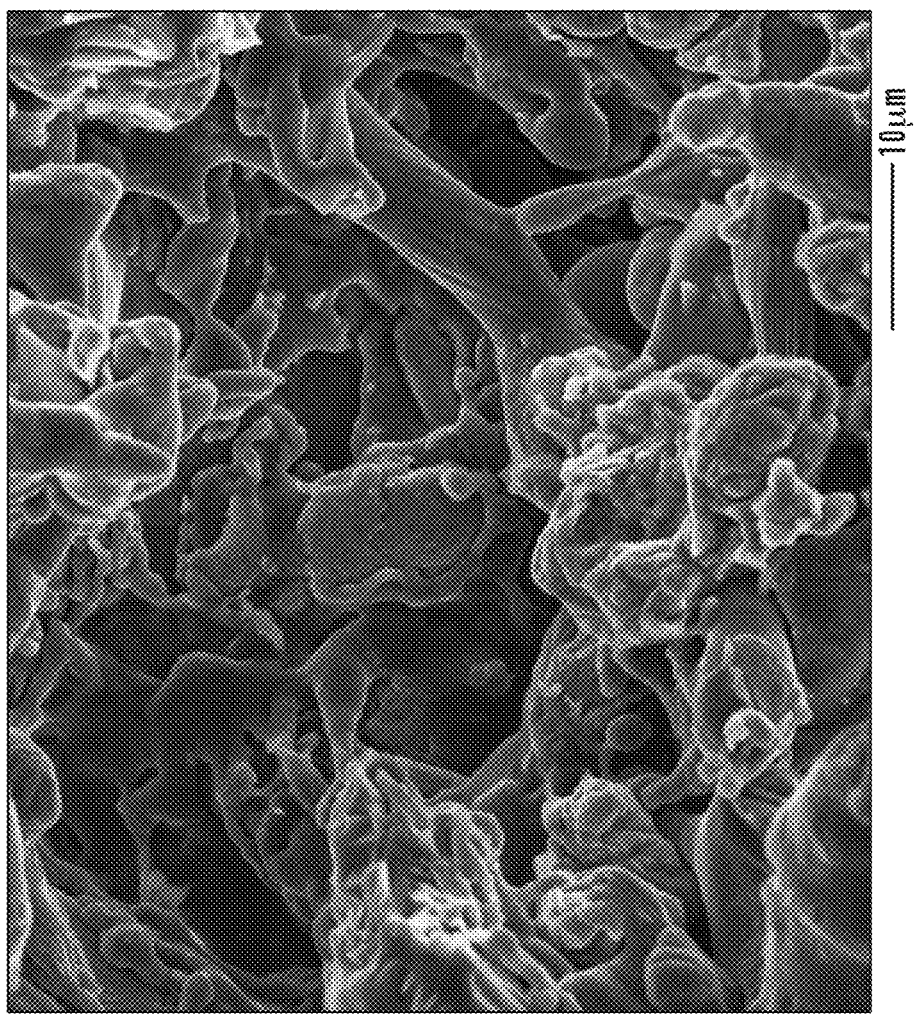
FIG. 6 is an SEM image of a shield surface stainless steel ("SS") coated according to Example 1 of the present invention.
Figure 7:
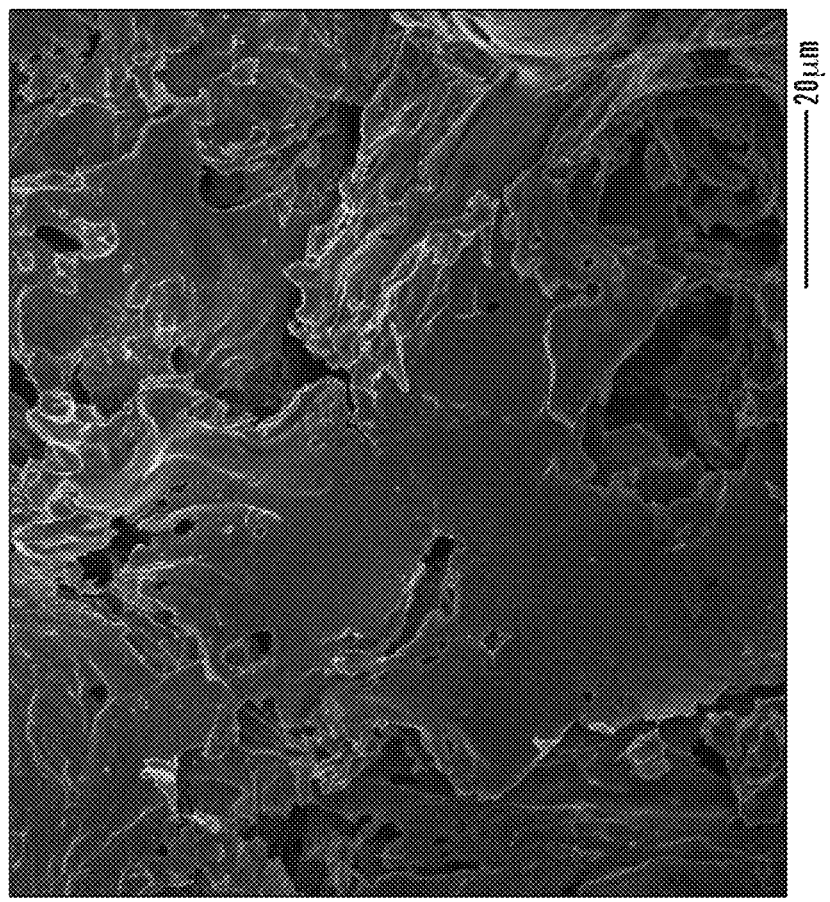
FIG. 7 is an SEM image of a shield surface SS coated according to Example 1 of the present invention.

Stainless steel shields that had been used in a deposition process were removed from the deposition chamber and pre-cleaned to provide primed shields. Masking was applied to the primed shields in preparation for the stainless steel coating. The coating was applied by a thin wire arc spray process to provide a stainless steel coating having a thickness of 100 microns and a surface roughness of from 450 to 550 microinches. The coating process leaves particle residue on top of the surface, thus the post cleaning of the coating is desired to remove the loose particles sitting on top of the coated surface. The mask coating was removed and shield parts were then exposed to a high pressure water rinse at a pressure of 2 kPa for a rinse time of 30 minutes. The shield parts were then dipped in a 0.5% $HNO_3$+0.5% HF+$H_2O$ solution for 15 minutes. The shield parts were then again exposed to a high pressure water rinse as that noted above. The shield parts were ultrasonicated for 5 minutes at 5 kHz and then for 5 minutes at 20 kHz. This process provided shields having a surface roughness of about 500 microinches and a surface particle density of less than about 0.1 particles/$mm^2$ of particles between about 1 micron and about 5 microns in size and no particles below about 1 micron in size. The shield parts were then vacuum baked and packed. FIG. 6 shows a pair of SEM images and FIG. 7 shows an SEM image of stainless steel coated shield surfaces according to Example 1.

Example 2

The restored shields of Comparative Example A and Example 1 were each placed in separate deposition chambers. 150 EUVL mask blanks were produced in each chamber. These blanks for each chamber were examined for defects and the ratio of the average defect count per target for shields prepared in Comparative Example A compared to those coated in Example 1 was determined to be a ratio of about 6.4 to 1.

Example 3

The restored shields of Comparative Example B and Example 1 were each placed in separate deposition chambers. 150 EUVL mask blanks were produced in each chamber. These blanks for each chamber were examined for defects and the ratio of the average defect count per target for shields coated in Comparative Example B compared to those coated in Example 1 was determined to be a ratio of about 4.6 to 1. The coated shields of Example B generated more particles than those of Example 1 as the aluminum coating was easier to sputter as compared to stainless steel, thus generating more particles during the deposition process. Additionally the deposition material provided better adherence to the stainless coatings as compared to the aluminum coatings generating less particle defects.

Developing stainless steel arc-sprayed coatings on a stainless steel shield surface proved the best solution to maintain the surface roughness of the shields as compared to coating the shields with Al coatings, which produced particle defects from the use of Al coated shields in deposition systems. The arc-spray deposited stainless steel coatings provided very high roughness (higher than 500 microinches) as shown in FIG. 3. The adherence of the coating with the shield surface was found to be excellent. Since the coating material was hard, aggressive post-cleaning processes were implemented, leaving little particle residue on the coating surface, as shown in FIG. 4. Additionally, during use of the shields of the present invention, the Mo and Si deposition also adhered well to the stainless steel coatings, which reduced flaking and particle generation.

While the invention has been described with preferred embodiments, it is to be understood that variations and modifications are to be considered within the purview and the scope of the claims appended hereto.

What is claimed is:

1. A method for coating a deposition chamber shield, comprising:
   a) providing a deposition chamber shield having a primed shield surface,
   b) coating the primed shield surface with a stainless steel coating having a thickness of from about 100 microns to about 250 microns, and
   c) cleaning the coated surface to remove loose particles to provide a stainless steel coated shield having a surface roughness of between about 300 microinches and about 800 microinches and a surface particle density of less than about 0.1 particles/mm$^2$ of particles between about 1 micron and about 5 microns in size and no particles below about 1 micron in size.

2. The method according to claim 1, wherein cleaning the coated surface comprises at least one of a chemical cleaning process, wash, and ultrasonication.

3. The method according to claim 2, wherein the chemical cleaning process comprises an acidic solution, basic solution, or combination thereof.

4. The method according to claim 3, wherein the acidic solution comprises an aqueous solution of $HNO_3+HF$.

5. The method according to claim 3, wherein the acidic solution comprises a 0.5% $HNO_3$+0.5% $HF+H_2O$ solution.

6. The method according to claim 3, wherein the basic solution comprises an aqueous solution of $KOH+KMnO_4$.

7. The method according to claim 3, wherein the basic solution comprises a 15 to 25% KOH+20 to 35% $KMnO_4$+ $H_2O$ solution.

8. The method according to claim 3, wherein the chemical cleaning process comprises a dip time of between about 30 seconds and about 30 minutes.

9. The method according to claim 2, wherein the wash comprises a high pressure water rinse at a pressure of from about 1 kPa to about 5 kPa for a rinse time of from about 10 minutes to about 50 minutes.

10. The method according to claim 2, wherein the wash comprises a high pressure water rinse at a pressure of about 2 kPa for a rinse time of about 30 minutes at a temperature of about 50° C.

11. The method according to claim 2, wherein the wash comprises a high pressure water rinse at a temperature of between about 50° C. and about 80° C.

12. The method according to claim 2, wherein the ultrasonication is performed at a setting of from about 1 kHz to about 1 GHz.

13. The method according to claim 2, wherein the ultrasonication comprises about 5 minutes at about 5 kHz and about 5 minutes at about 20 kHz.

14. The method according to claim 1, wherein the deposition chamber shield comprises a stainless steel shield.

15. A method for coating a deposition chamber shield, comprising:
   a) providing a deposition chamber shield having a primed shield surface,
   b) coating the primed shield surface with a stainless steel coating having a thickness of from about 100 microns to about 250 microns, and
   c) cleaning the coated surface by washing with a high pressure water rinse of about 2 kPa for a rinse time of about 30 minutes at a temperature of about 50° C., cleaning by a chemical process including an acid clean, a basic clean, or combinations thereof for a dip time of from about 30 seconds to about 30 minutes, and providing ultrasonication at a setting of from about 1 kHz to about 1 GHz to remove loose particles to provide a stainless steel coated shield having a surface roughness of between about 300 microinches and about 800 microinches and a surface particle density of less than about 0.1 particles/mm$^2$ of particles between about 1 micron and about 5 microns in size and no particles below about 1 micron in size.

16. The method of claim 1, wherein said step c is performed after said step b.

17. The method of claim 15, wherein said step c is performed after said step b.

* * * * *